(12) United States Patent
Terada et al.

(10) Patent No.: US 6,498,519 B1
(45) Date of Patent: Dec. 24, 2002

(54) VOLTAGE CONTROL CIRCUIT NETWORK DEVICE AND METHOD OF DETECTING VOLTAGE

(75) Inventors: Yutaka Terada; Hiroyuki Yamauchi; Hironori Akamatsu; Tadahiro Yoshida; Satoshi Takahashi; Takashi Hirata; Yukio Arima; Yoshihide Komatsu, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/498,339

(22) Filed: Feb. 4, 2000

(30) Foreign Application Priority Data

Feb. 5, 1999 (JP) .......................................... 11-028520

(51) Int. Cl.[7] .............................................. H03K 5/153
(52) U.S. Cl. .............................. 327/77; 327/78; 327/80
(58) Field of Search ............................ 327/77, 78, 80, 327/81, 89, 143, 198

(56) References Cited

U.S. PATENT DOCUMENTS 5,057,789 A * 10/1991 Nagaraj ...................... 330/264
5,568,083 A * 10/1996 Uchiyama et al. ........... 327/538
5,589,719 A * 12/1996 Fiset .......................... 307/131
5,682,111 A * 10/1997 Bacrania et al. ............. 327/143
5,804,958 A * 9/1998 Tsui et al. .................... 323/313

FOREIGN PATENT DOCUMENTS

JP   10-79192    3/1998
JP   10-214122   8/1998

* cited by examiner

Primary Examiner—Tuan T. Lam
Assistant Examiner—Hiep Nguyen
(74) Attorney, Agent, or Firm—McDermott, Will & Emery

(57) ABSTRACT

A voltage control circuit for implementing, e.g., the CPS function in which a high-accuracy comparison is performed between a high external voltage and a reference voltage. A diode-connected transistor converts the external voltage to a voltage lower than the external voltage in conjunction with an external voltage dropping resistor. A comparator compares the converted voltage with a specified comparison voltage. The size of the transistor is determined such that the ratio of an increment of the converted voltage to an increment of the external voltage is sufficiently high in a comparison region in which the external voltage is close to the reference voltage. A clamping circuit clamps the converted voltage with a specified limit voltage such that the converted voltage does not exceed the withstand voltage of the circuit.

11 Claims, 11 Drawing Sheets

VOLTAGE CONTROL CIRCUIT NETWORK DEVICE AND METHOD OF DETECTING VOLTAGE

BACKGROUND OF THE INVENTION

The present invention relates to a voltage control circuit having the function of detecting which one of a reference voltage and an external supply voltage, such as a power source voltage supplied via a cable by the function of cable power status (CPS) conforming to, e.g., IEEE 1394 standard, is higher.

With the wide proliferation of multimedia centering around personal computers, the function of processing enormous amounts of data such as image data at a high speed has been required of each information device. Concurrently, technology for increasing a rate at which data is transferred between devices has been becoming important. Under such circumstances, the IEEE 1394 standard has been proposed as technology which enables high-speed data transfer, based on which development has been pursued. The IEEE 1394 standard suggests a serial transfer method whereby a transfer rate is increased by unprecedentedly reducing the number of buses, while increasing an operational frequency for transfer.

Figure 8:
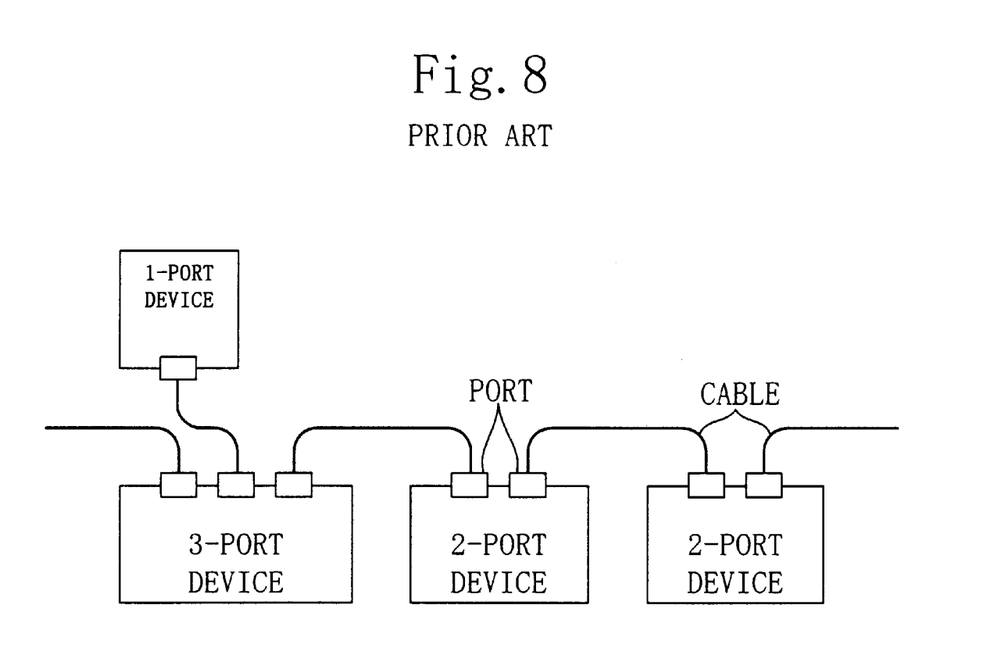
FIG. 8 shows a part of a configuration of a network system.

FIG. 8 shows a part of a configuration of an IEEE 1394 network system. In FIG. 8, individual network devices are connected to each other via cables. Each of the cables is composed of four data lines (a pair of data lines and a pair of strobe lines), a power source line, and a ground line. Depending on the type of a cable, only four lines compose the cable without using the power source line and the ground line.

An LSI compliant with the IEEE 1394 standard can be divided into a PHY section for primarily controlling data input and data output and a LINK section for controlling a transfer protocol. During data reception, a signal is transferred from a transfer cable to the PHY section and then from the PHY section to the LINK section. During data transmission, the signal is transferred in the opposite direction.

Besides high-speed data transfer, the IEEE 1394 standard also supports the CPS function for supplying power from a power source via the data transfer cable. The IEEE 1394 standard includes a plurality of standards such as IEEE 1394_1995, IEEE 1394. A, and IEEE 1394. B and the CPS function is defined in each of the standards.

That is, in an LSI compliant with the IEEE 1394 standard, the CPS function should be operated when the power-source voltage supplied via the cable is within a specified range. Since the CPS function is the standard for the PHY section for controlling data input and data output, it is necessary for the PHY section to have the function of detecting whether or not the power source voltage supplied via the cable is within the specified range.

In the IEEE 1394_1995, e.g., the voltage supplied from the outside by the CPS function is defined to be 8 to 40 V. This means that the CPS function should be operated when the voltage is at least in the range of 8 to 40 V. To develop an LSI compliant with the standard, therefore, it is necessary to provide the function of detecting whether or not the voltage supplied from the cable is within the range of 8 to 40 V.

PROBLEMS TO BE SOLVED

However, the application of a high voltage of 8 to 40 V directly to an LSI leads to the breakdown of the LSI and is not preferred. For this reason, the standard proposes reducing a supply voltage via a 400-k Ω voltage dropping resistor and applying a reduced voltage to the PHY section. Consequently, the PHY section is so configured as to estimate the supply voltage by detecting the reduced voltage so that the accuracy of voltage drop as well as the accuracy of voltage detection are important factors in observing the standard.

As far as the present inventors have investigated, however, there has been proposed no circuit configuration which conforms to the standard.

Figure 10:
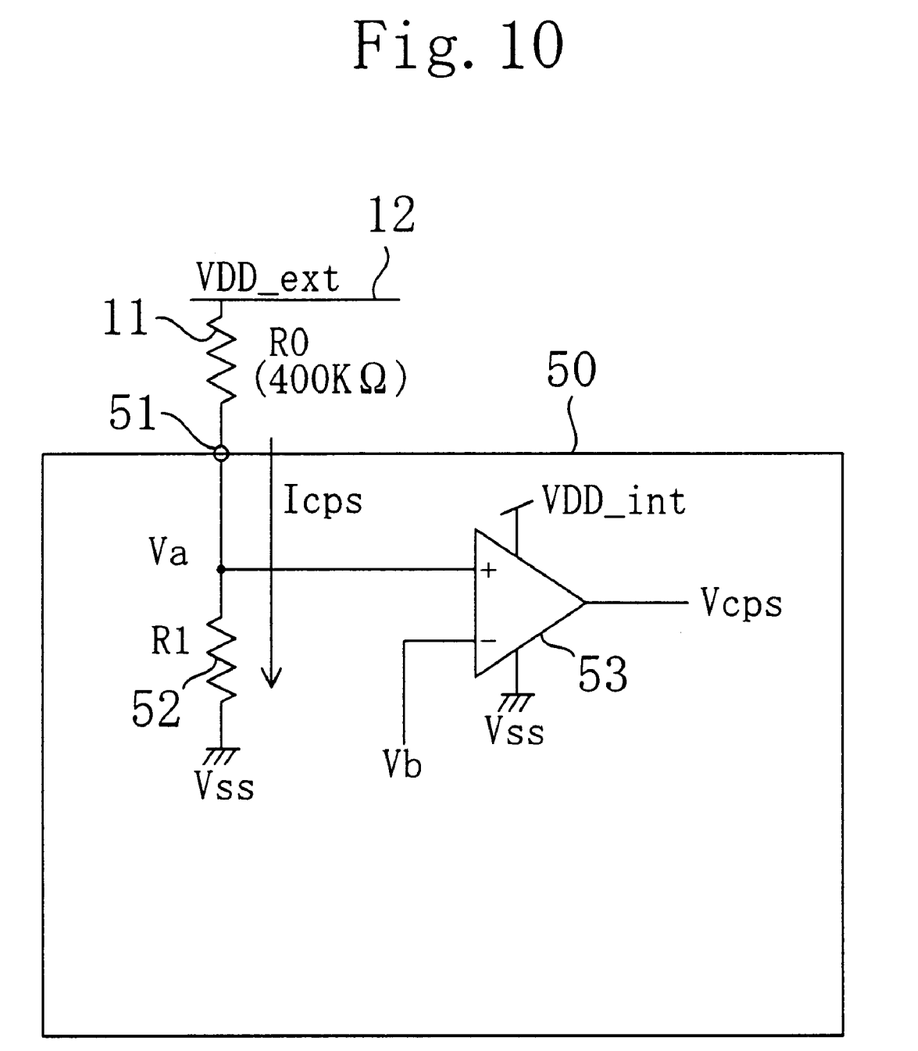
FIG. 10 shows a configuration of a circuit conforming to the IEEE 1394 standard which has been devised by the present inventors and FIG. 11 is a graph showing the relationship between the external voltage and an internal voltage in the circuit configuration of FIG. 10.

FIG. 10 shows a circuit configuration of a voltage determining unit 15 conforming to the standard, which has been devised by the present inventors. In FIG. 10, a cable 12 is connected to an input terminal 51 of a voltage control circuit 50 via a voltage dropping resistor 11 (having a resistance value R0). In the voltage control circuit 50, a resistor element 52 (having a resistance value R1) is connected to the input terminal 51 to be disposed in series to the resistor 11. A current Icps flows from the cable 12 to the ground Vss and an external voltage VDD_ext is converted to a voltage Va in the voltage control circuit 50. A comparator 53 compares the converted voltage Va with a comparison voltage Vb and outputs a signal Vcps indicative of the result of comparison. The signal Vcps becomes HIGH when the converted voltage Va is higher than the comparison voltage Vb, which enables the detection of the supply of a voltage that can be supplied via the cable as the external voltage VDD_ext.

Figure 11:
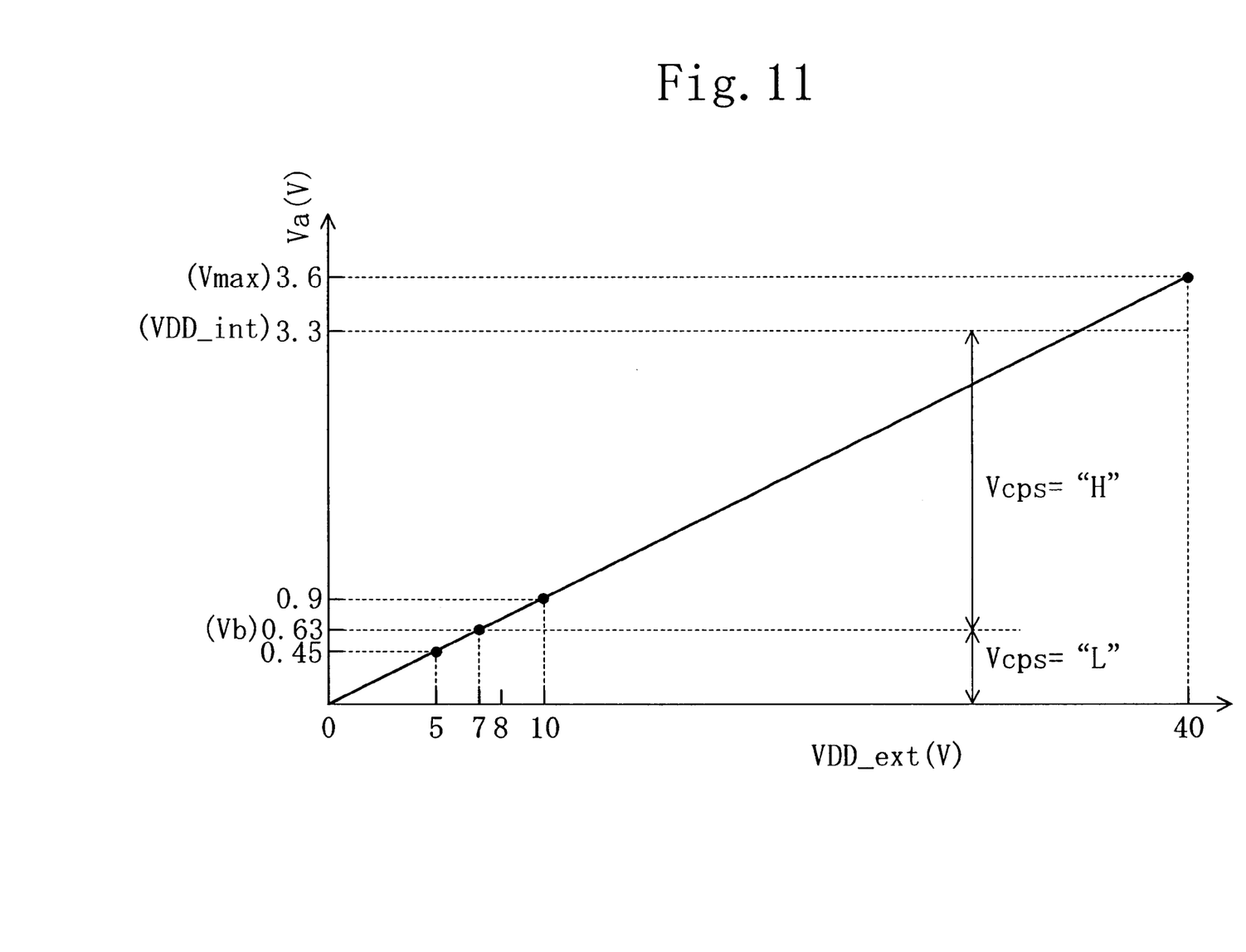

FIG. 11 is a graph showing the relationship between the external voltage VDD_ext and the converted voltage Va in the circuit configuration of FIG. 10. In FIG. 11, a power-source voltage VDD_int to the voltage control circuit 50 is assumed to be 3.3 V and a maximum withstand voltage Vmax is assumed to be 3.6 V. As shown in FIG. 11, the external voltage VDD_ext and the converted voltage Va are constantly in a proportional relationship in the circuit configuration of FIG. 10. The resistance value R1 is adjusted to such a value that the converted voltage Va does not exceed the maximum withstand voltage Vmax of 3.6 V even when 40 V is given as the external voltage VDD_ext. Hence, $$R1 = 3.6 \cdot R0/(40-3.6) = 0.0989 \cdot 400 \text{ k} = 39.56 \text{ k}\Omega$$

is derived from $$3.6/R1 = 40/(R0+R1).$$

If the maximum value of the converted voltage Va is set to 3.3 V by allowing a margin, $$R1 = 3.3 \cdot R0/(40-3.3) = 0.0899 \cdot R0 = 39.95 \text{ k}\Omega$$

is satisfied. Therefore, the resistance value R1 of the resistor element 52 is preferably adjusted to be in the range of 35 kΩ to 40 kΩ. It will easily be appreciated that the resistance value R1 of the resistor element 52 varies depending on the voltage supplied via the cable, the maximum withstand voltage, or the resistance value of the voltage dropping resistor.

Although the reference voltage serving as the standard for determining the external voltage VDD_ext is 8 V, the reference voltage has been set to 7 V and the comparison voltage Vb has been set to 0.63 V, since it is common to set the reference voltage to the order of 5 V to 7.5 V by allowing a margin. The comparison voltage Vb is set appropriately based on the reference voltage and on the ratio between the respective resistance values of the voltage dropping resistor 11 and the resistor element 52.

In a circuit configuration as shown in FIG. 10, however, the external voltage VDD_ext and the converted voltage Va are in the proportional relationship and the converted voltage Va is about 1/10 of the external voltage VDD_ext. If the external voltage VDD_ext varies greatly, therefore, the converted voltage Va changes only by about 1/10 of the variation of the external voltage VDD_ext. Conversely, variations in comparison voltage Vb and variations in the detection accuracy of the comparator 53 are magnified ten times to affect the detection of the external voltage VDD_ext. Variations in the resistance of the resistor 52 also greatly affect the accuracy with which the external voltage VDD_ext is detected.

On the other hand, it is considered that an input to the comparator is preferably set to about 1/2 of the power-source voltage in terms of sensitivity. In the circuit configuration of FIG. 10, the level of the input to the comparator 53 is close to the ground potential Vss, which is not preferred in terms of detection accuracy.

SUMMARY OF THE INVENTION

It is therefore an object of the present invention to perform a high-accuracy comparison between an external voltage and a reference voltage in a voltage control circuit for implementing, e.g., the CPS function. To attain the object, the present invention has widened the range of a converted voltage in a region in which the external voltage is close to the reference voltage and shifted the range to higher voltages, thereby increasing the accuracy of comparison between the external voltage and the reference voltage.

Specifically, the present invention in a first aspect is a voltage control circuit for detecting which one of an external voltage supplied from the outside and a reference voltage serving as a standard for comparison is higher, the circuit comprising: an input terminal to which the external voltage is applicable via a voltage dropping resistor; voltage converting means for converting, in conjunction with the voltage dropping resistor, the external voltage applied to the input terminal to a voltage lower than the external voltage; and comparing means for comparing a converted voltage outputted from the voltage converting means with a specified comparison voltage corresponding to the reference voltage and outputting a signal indicative of the result of comparison as a signal indicative of which one of the external voltage and the reference voltage is higher, the voltage converting means performing a voltage conversion such that a ratio of an increment of the converted voltage to an increment of the external voltage is relatively high in a comparison region in which the external voltage is close to the reference voltage and relatively low in a region in which the external voltage is higher than in the comparison region.

In accordance with the present invention in the first aspect, the voltage converting means performs a conversion such that the ratio of the increment of the converted voltage to the increment of the external voltage is relatively high in the comparison region and relatively low in a region in which the external voltage is higher than in the comparison region. This provides a wide range of converted voltages in the comparison region, while controlling the converted voltage in a region in which the external voltage has a value higher than in the comparison region such that the converted voltage does not exceed the withstand voltage. This remarkably suppresses the influence given by the varying comparison voltage and the varying detection accuracy of the comparing means on the external voltage, so that the accuracy of a comparison made between the external voltage and the reference voltage is increased.

Preferably, the voltage converting means in the voltage control circuit comprises a diode or diode-connected transistor connected to the input terminal to be disposed in series to the voltage dropping resistor. Preferably, the comparing means in the voltage control circuit comprises comparison voltage generating means for generating the comparison voltage, the comparison voltage generating means comprising: a constant current source; and a diode or diode-connected transistor disposed in series to the constant current source.

Alternatively, the voltage converting means in the voltage control circuit comprises: a voltage dropping element connected to the input terminal to be disposed in series to the voltage dropping resistor; and a clamping circuit for limiting a voltage on a side of the voltage dropping element closer to the input terminal such that the voltage does not exceed a specified limit voltage.

Preferably, the clamping circuit comprises: a transistor disposed in parallel with the voltage dropping element; and a comparator for receiving a drain voltage of the transistor as one input and the limit voltage as the other input, an output of the comparator serving as an input to a gate of the transistor. Alternatively, the clamping circuit comprises a single diode or diode-connected transistor disposed in parallel with the voltage dropping element or a plurality of diodes or diode-connected transistors disposed in series to each other and in parallel with the voltage dropping element. Preferably, the voltage dropping element is a resistor, a diode, or a diode-connected transistor.

In a second aspect, the present invention is a network device connectable to a cable, the device comprising a voltage determining unit for determining whether or not an external supply voltage supplied via the cable is within a specified range, the voltage determining unit comprising: a voltage control circuit as recited in claim 1; and a voltage dropping resistor having one end connected to the input terminal of the voltage control circuit and the other end to which the external supply voltage is given.

In a third aspect, the present invention is a voltage control circuit for detecting which one of an external voltage supplied from the outside and a reference voltage serving as a standard for comparison is higher, the circuit comprising: an input terminal to which an external voltage is applicable via a voltage dropping resistor; a resistor element having one end connected to the input terminal and the other end grounded; and a comparator for comparing a voltage at the one end of the resistor element with a specified comparison voltage corresponding to the reference voltage and outputting a signal indicative of the result of comparison as a signal indicative of which one of the external voltage and the reference voltage is. higher.

Preferably, the voltage dropping resistor in the voltage control circuit has a resistance value of 400 kΩ and the resistor element has a resistance value of 35 kΩ to 40 kΩ.

Preferably, the specified comparison voltage is determined based on the reference voltage and on a ratio between respective resistance values of the voltage dropping resistor and the resistor element.

In a fourth aspect, the present invention is a method of detecting, in a network device, which one of an external supply voltage supplied via a cable and a reference voltage serving as a standard for comparison is higher, the method comprising the steps of: converting the external supply voltage to a voltage lower than the external supply voltage; and comparing a converted voltage obtained in the voltage converting step with a specified comparison voltage corresponding to the reference voltage, the voltage converting step performing a voltage conversion such that a ratio of an increment of the converted voltage to an increment of the external supply voltage is relatively high in a comparison region in which the external supply voltage is close to the reference voltage and relatively low in a region in which the external supply voltage is higher than in the comparison region.

DETAILED DESCRIPTION OF THE INVENTION

Referring now to the drawings, the embodiments of the present invention will be described by using, as examples, configurations conforming to the CPS function conforming to the IEEE 1394 standard.

EMBODIMENT 1

Figure 1:
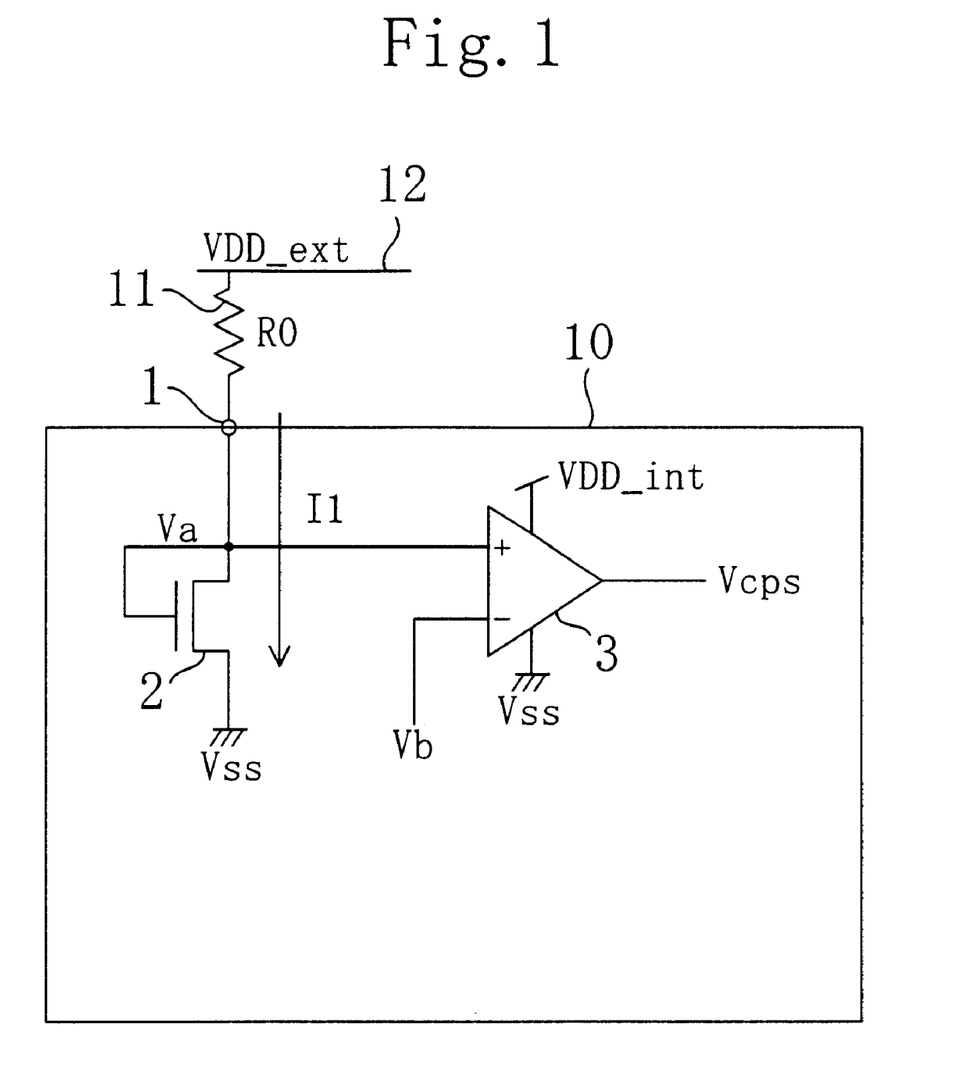
FIG. 1 shows a configuration of a voltage control circuit according to a first embodiment of the present invention.

FIG. 1 is a view showing a configuration of a voltage control circuit according to a first embodiment of the present invention. FIG. 1 depicts only a structure for making a comparison between an external voltage VDD_ext supplied via a cable and a reference voltage in a voltage control circuit 10. In FIG. 1, a reference numeral 2 denotes a diode-connected N-type MOS transistor. The MOS transistor 2 has a drain and a gate each connected to an input terminal 1 and a source connected to the ground Vss. The MOS transistor 2 is so configured as to be disposed in series to an external voltage dropping resistor 11 connected to the input terminal 1. The MOS transistor 2 composes voltage converting means. In FIG. 1, a reference numeral 3 denotes a comparator as comparing means for comparing the drain voltage Va of the MOS transistor 2 as a converted voltage with a comparison voltage Vb and outputting a signal Vcps indicative of the result of comparison as a signal indicative of which one of the external voltage VDD_ext and the reference voltage is higher.

Figure 2:
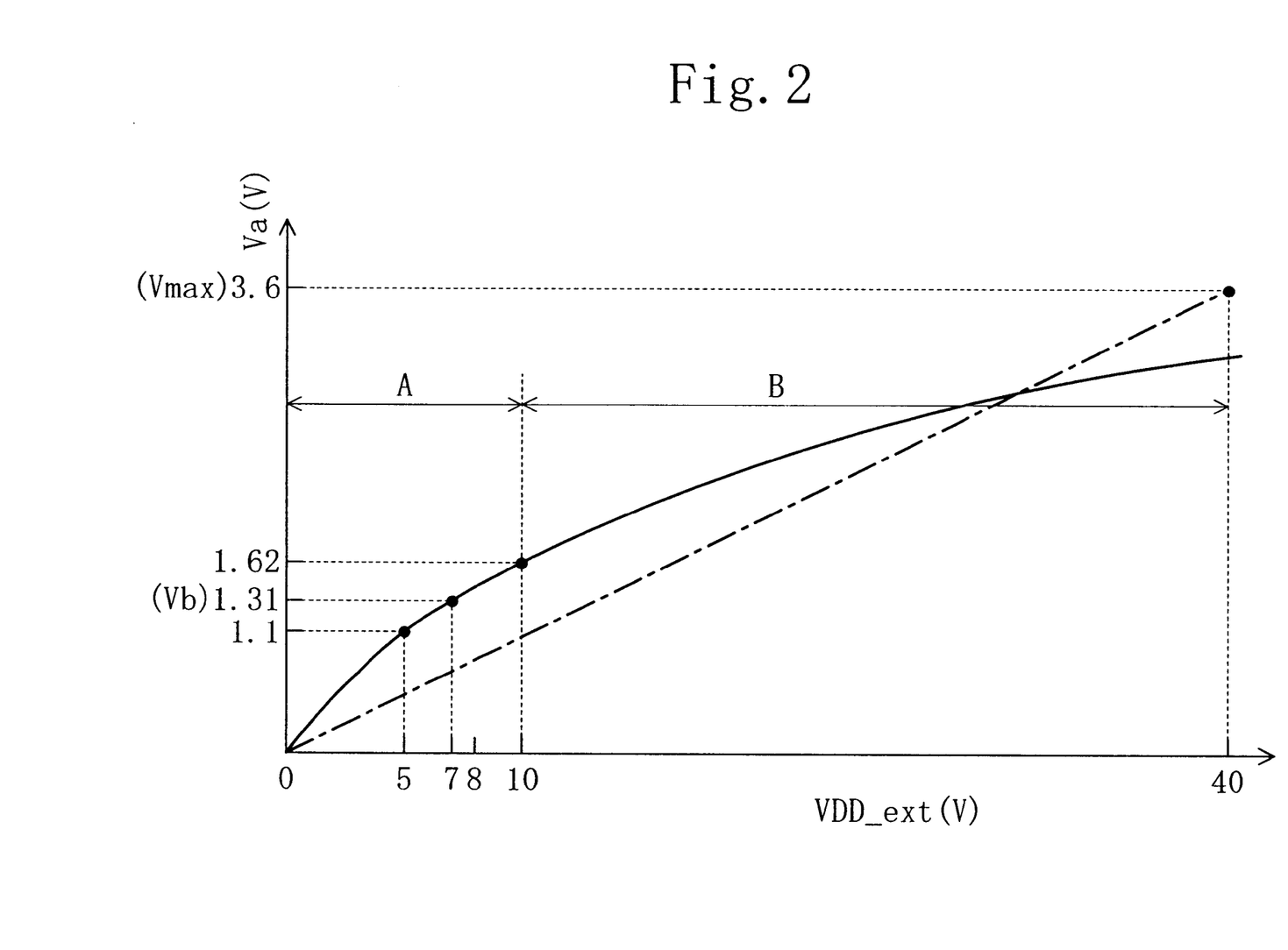
FIG. 2 is a graph showing the relationship between an external voltage and a converted voltage in the circuit configuration of FIG. 1.

FIG. 2 is a graph showing the relationship between the external voltage VDD_ext and the converted voltage Va in the circuit configuration of FIG. 1. Since the MOS transistor 2 is in a diode-connected configuration, the converted voltage Va exhibits a diode characteristic, i.e., a square characteristic (saturation characteristic). Therefore, as shown in FIG. 2, the slope of the curve on the graph is sharp in a region in which the external voltage VDD_ext is low. By contrast, the rising curve representing the converted voltage Va is gentler as the external voltage VDD_ext is higher. The curve representing the diode characteristic is determined by the size of the MOS transistor 2.

In terms of the detection performance of the circuit, the slope of the curve in a comparison region A in which the external voltage VDD_ext is low and close to the reference voltage is preferably sharper. As the slope of the curve in the comparison region A is sharper, however, the converted voltage Va in a region in which the external voltage VDD_ext is higher than in the comparison region A increases and exceeds, in some cases, a withstand voltage Vmax. Hence, it is desirable to optimize the size of the MOS transistor 2 so long as the converted voltage Va does not exceed the withstand voltage Vmax when the external voltage VDD_ext is 40 V. It is to be noted that the upper-limit voltage 40 V in accordance with the standard has been determined from the viewpoint of protecting the circuit and there is no necessity to disable the operation of the circuit if the external voltage VDD_ext exceeds 40 V. Accordingly, it is sufficient to prevent the converted voltage Vs from exceeding the withstand voltage Vmax when the external voltage VDD_ext is 40 V and it is not necessarily required to determine which one of the external voltage VDD_ext and 40 V is higher.

Thus, according to the present invention, it is possible to (1) increase the ratio of an increment of the converted voltage Va to an increment of the external voltage VDD_ext (slope of the curve) in the comparison region A in which the external voltage VDD_ext is close to the reference voltage, resulting in higher detection accuracy. Moreover, the comparison voltage Vb can be set to a higher level on the order of ½ of an internal power-source voltage VDD_int. In addition, it is also possible to (2) control the converted voltage Va such that it does not exceed the maximum withstand voltage Vmax in the region B in which the external voltage VDD_ext is higher than in the comparison region A. The present embodiment has employed the single transistor 2 to implement the characteristics in the regions A and B by using the diode characteristic.

For example, in FIG. 11 described above in Problems to be Solved, the converted voltage Va varies in the range of 0.45 V to 0.9 V when the external voltage VDD_ext varies in the range of 5 V to 10 V. In FIG. 2, by contrast, the converted voltage Va varies in the range of 1.1 V to 1.62 V when the external voltage VDD_ext varies in the range of 5 V to 10 V. In short, the converted voltage Va varies in a wider range and has a higher level when the external voltage VDD_ext is in a specified range close to the reference voltage. This reduces the influence of variations in comparison voltage Vb and variations in detection accuracy and increases the detection sensitivity of the comparator, resulting in higher detection accuracy.

VARIATION OF EMBODIMENT 1

Figure 3:
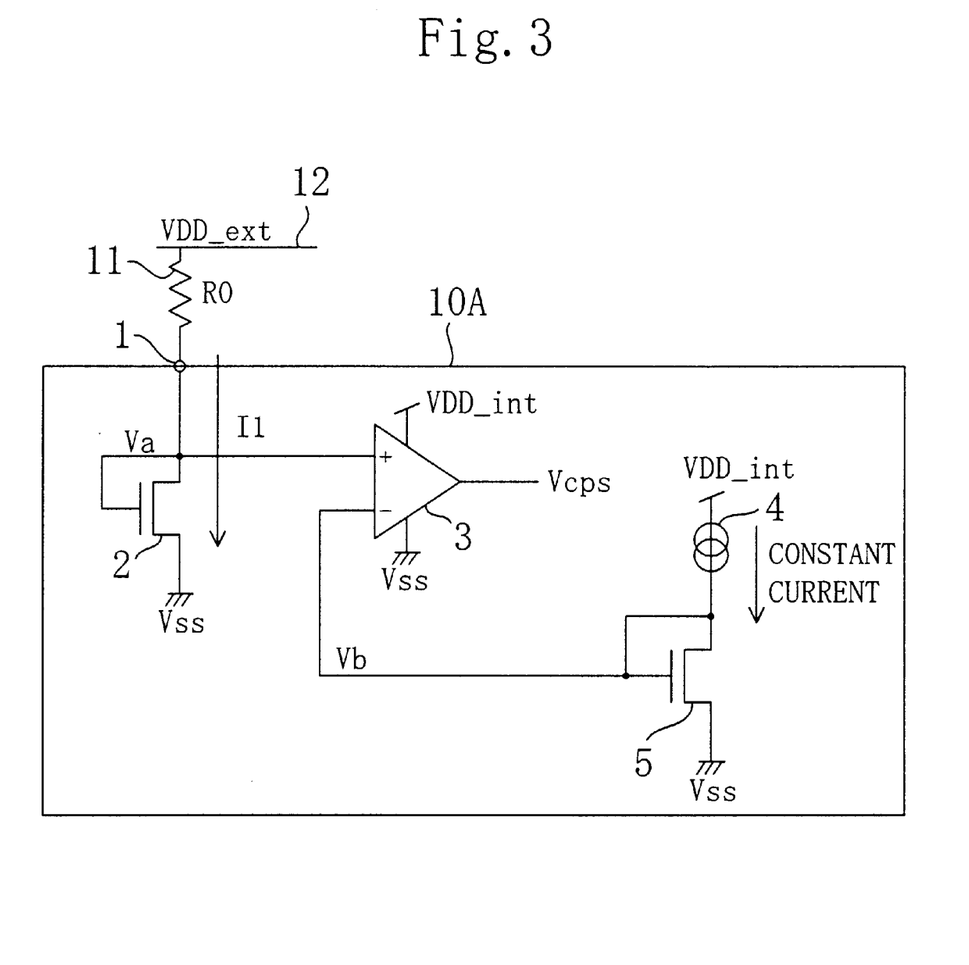
FIG. 3 is a circuit diagram of a variation of the first embodiment.

FIG. 3 is a circuit diagram of a variation of the first embodiment of the present invention. A voltage control circuit 10A shown in FIG. 3 comprises a constant current source 4 and a diode-connected N-type MOS transistor 5 as comparison voltage generating means for generating a comparison voltage Vb. The comparison voltage generating means and the comparator 3 compose comparing means.

Compared with the configuration of FIG. 10, the first embodiment has widened the range of the converted voltage Va when the external voltage Vdd_ext is close to the reference voltage. If the characteristics of the transistor 2 vary due to varying processes or varying temperatures, the converted voltage Va may also vary disadvantageously. The present variation has given a further consideration to the varying characteristics of the transistor 2.

In FIG. 3, the transistor 5 is in a diode-connected configuration in which the drain and the gate are connected to each other, similarly to the transistor 2, and the constant current source 4 is connected to the drain of the transistor 5. Consequently, a given current is supplied constantly from the constant current source 4 to the transistor 5 and the gate voltage of the transistor 5 is outputted as the comparison voltage Vb.

In the configuration of FIG. 3, the comparator 3 compares the converted voltage Va under the control of the transistor 2 with the comparison voltage Vb under the control of the transistor 5. Accordingly, even if the converted voltage Va varies due to the varying characteristics of the transistor 2, the comparison voltage Vb also varies due to the varying characteristics of the transistor 5 and the voltages Va and Vb vary in the same direction. Hence, the difference therebetween is unaffected by the voltage variations. This prevents an erroneous detection resulting from the varying characteristics of the transistor 2 and improves detection performance.

EMBODIMENT 2

If the size of the transistor 2 is adjusted such that a current I1 flowing in the transistor 2 is further reduced, the entire curve of FIG. 2 is elevated and the slope of the curve in the comparison region A is more sharpened. This further widens the range of the converted voltage Va when the external voltage VDD_ext is close to the reference voltage, resulting in higher detection accuracy. In this case, however, the converted voltage Va may exceed the withstand voltage Vmax in the region B in which the external voltage VDD_ext is higher than in the comparison region A.

To prevent this, a clamping circuit for limiting the converted voltage Va such that it does not exceed a given limit value is provided in a second embodiment of the present invention. The arrangement further increases the ratio of an increment of the converted voltage Va to an increment of the external voltage VDD_ext in the comparison region A in which the external voltage VDD_ext is close to the reference voltage.

Figure 4:
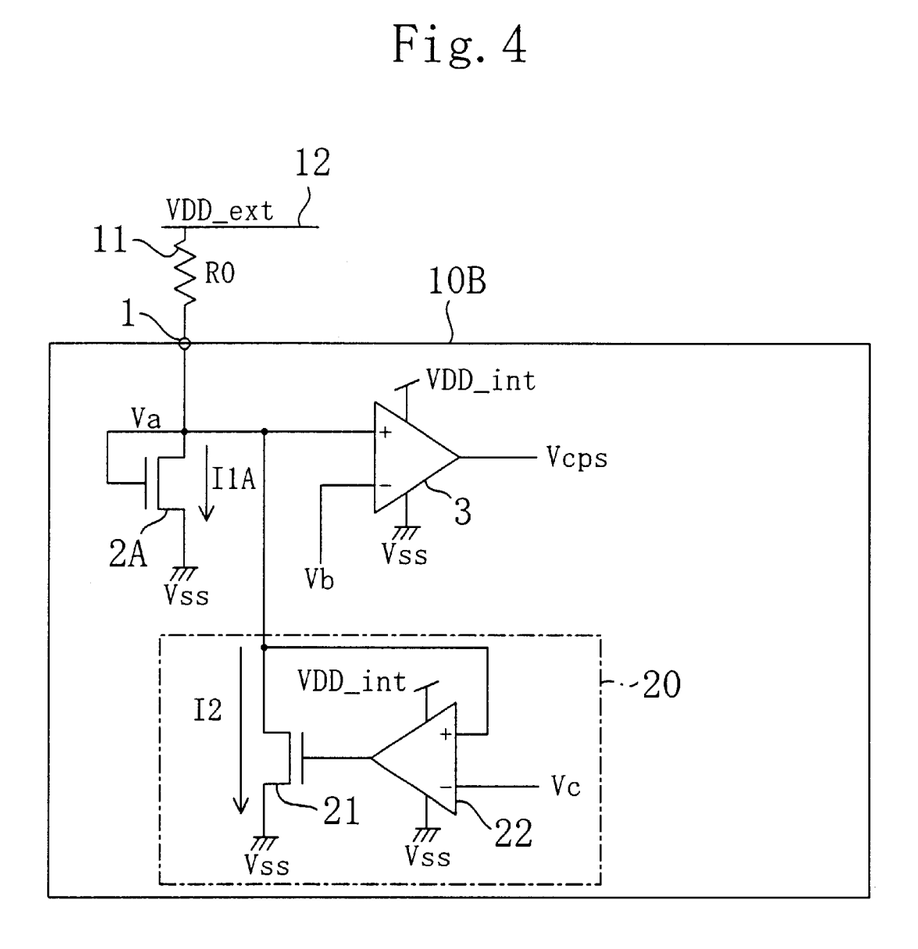
FIG. 4 shows a configuration of a voltage control circuit according to a second embodiment of the present invention.

FIG. 4 shows a configuration of a voltage control circuit according to the second embodiment. A reference numeral 2A denotes a diode-connected N-type MOS transistor as a voltage dropping element. The transistor 2A is configured to have a smaller gate width and a larger gate length than the transistor 2 of FIG. 1. Accordingly, a current I2A flowing in the transistor 2A is smaller than the current I1 flowing in the transistor 2 of FIG. 1. A reference numeral 20 denotes the clamping circuit for limiting the converted voltage Va such that it does not exceed the specified limit voltage Vc. The clamping circuit 20 comprises an N-type MOS transistor 21 provided in parallel with the transistor 2A and a comparator 22 which receives, as one input, the drain voltage of the transistor 21, i.e., the converted voltage Va and receives the limit voltage Vc as the other input. An output of the comparator 22 is inputted to the gate of the transistor 21. It is assumed that the internal power-source voltage VDD_int is constantly applied.

The comparator 22 compares the converted voltage Va with the limit voltage Vc and outputs HIGH if the converted voltage Va is higher. At this time, the transistor 21 is turned ON because the gate voltage becomes HIGH so that a current I2 is allowed to flow from the drain of the transistor 2A to the ground Vss. As a result, the converted voltage Va is prevented from exceeding the limit voltage Vc. In other words, the converted voltage Va is clamped with the limit voltage Vc.

Figure 5:
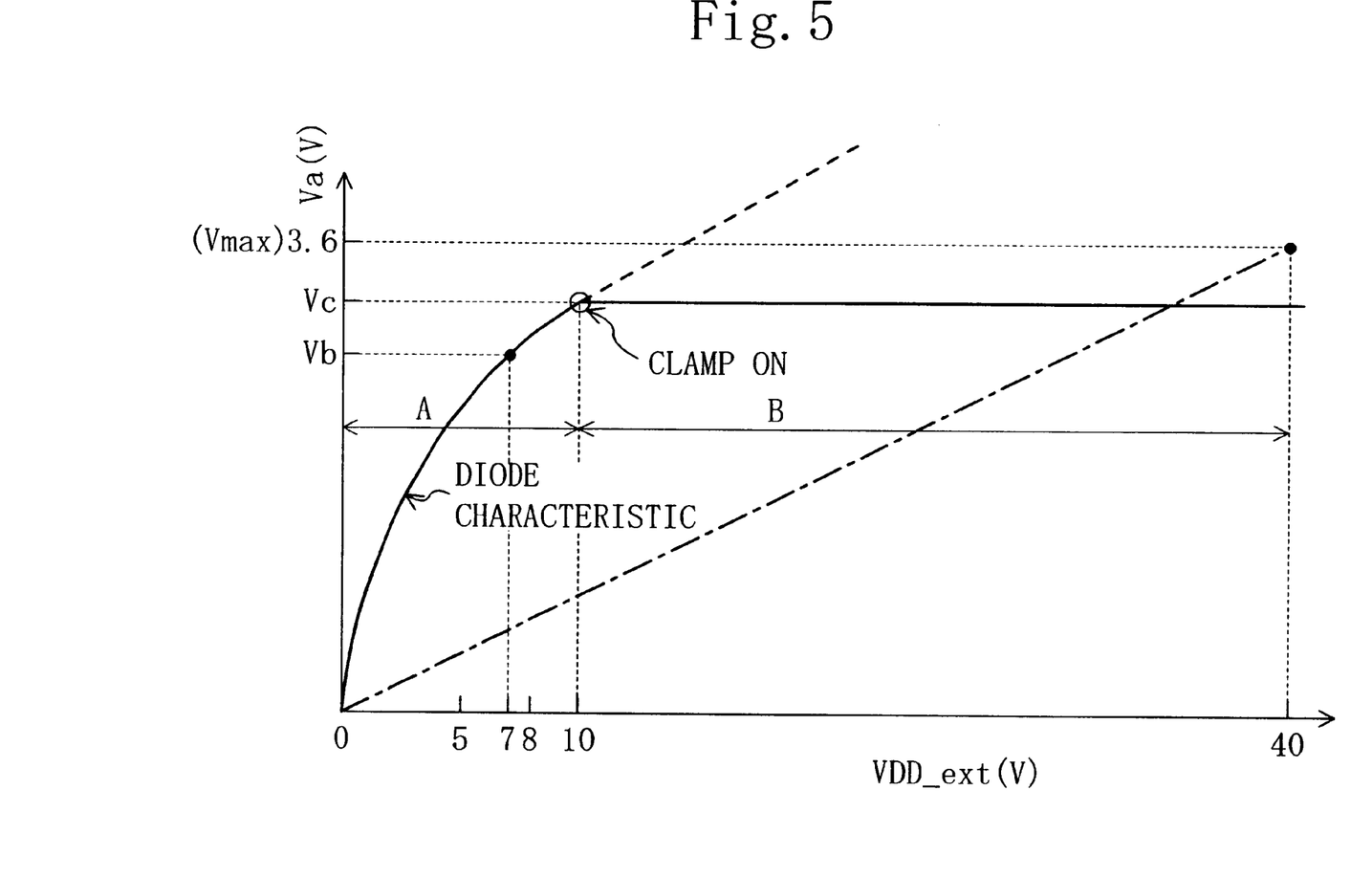
FIG. 5 is a graph showing the relationship between the external voltage and the converted voltage in the circuit configuration of FIG. 4.

FIG. 5 is a graph showing the relationship between the external voltage VDD_ext and the converted voltage Va in the circuit configuration of FIG. 4. As shown in FIG. 5, the slope of the curve is sharpened in the comparison region A through the size adjustment of the transistor 2A and the range of the converted voltage Va when the external voltage VDD_ext is close to the reference voltage is wider than in FIG. 2. In the region B, on the other hand, the clamping circuit 20 restricts the upper limit of the converted voltage Va to the limit voltage Vc so that the converted voltage Va does not exceed the withstand voltage Vmax.

VARIATION OF EMBODIMENT 2

Figure 6:
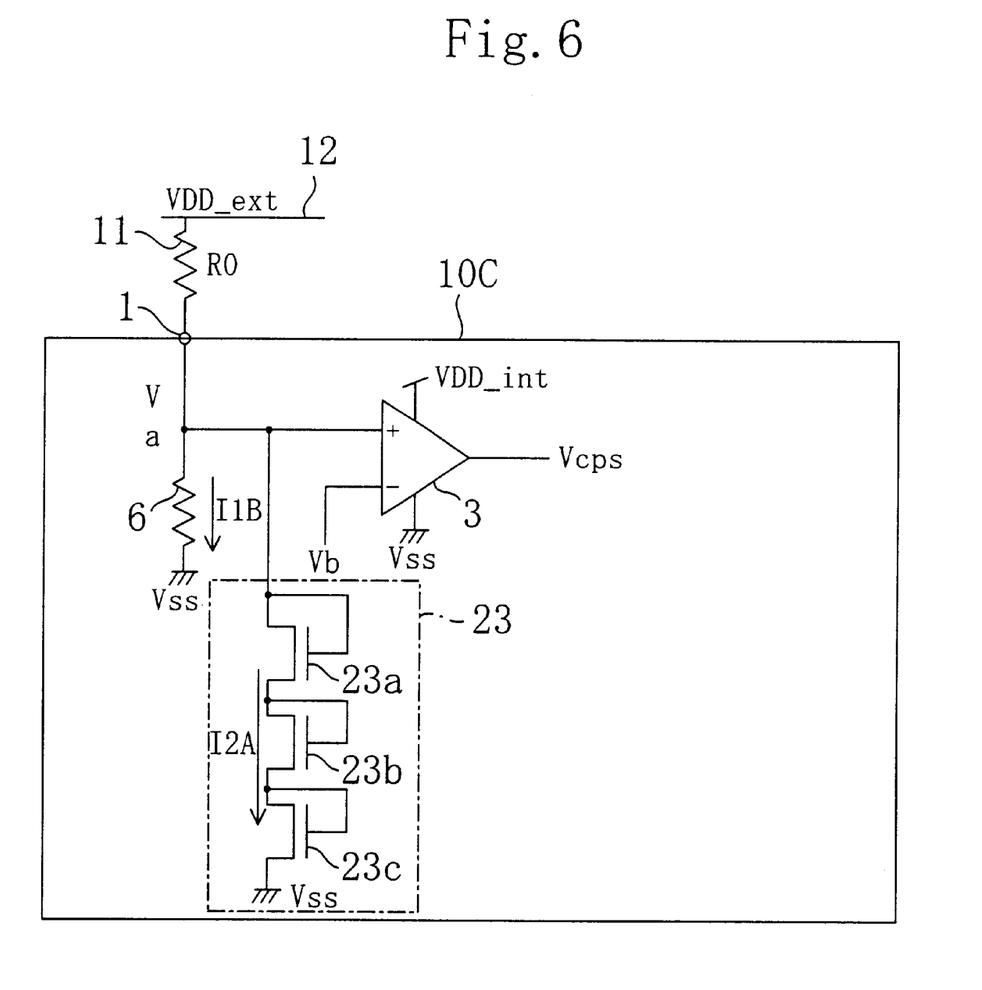
FIG. 6 is a circuit diagram of a variation of the second embodiment.

FIG. 6 is a circuit diagram of a variation of the second embodiment. A voltage control circuit 10C shown in FIG. 6 comprises a resistor 6 as a voltage dropping circuit instead of the transistor 2A of FIG. 4 and a clamping circuit 23 having three diode-connected N-type MOS transistors 23a, 23b, and 23c disposed in series to each other and in parallel with the resistor 6 instead of the clamping circuit 20. Each of the transistors 23a, 23b, and 23c of the clamping circuit 23 is turned ON if the converted voltage Va exceeds 3 Vt (Vt is the threshold voltage of each of the N-type MOS transistors) so that a current I2A is allowed to flow from the end of the resistor 6 closer to the input terminal to the ground Vss. Accordingly, the converted voltage Va is prevented from exceeding 3 Vt. In other words, the converted voltage Va is clamped with 3 Vt as the specified limit voltage.

Figure 7:
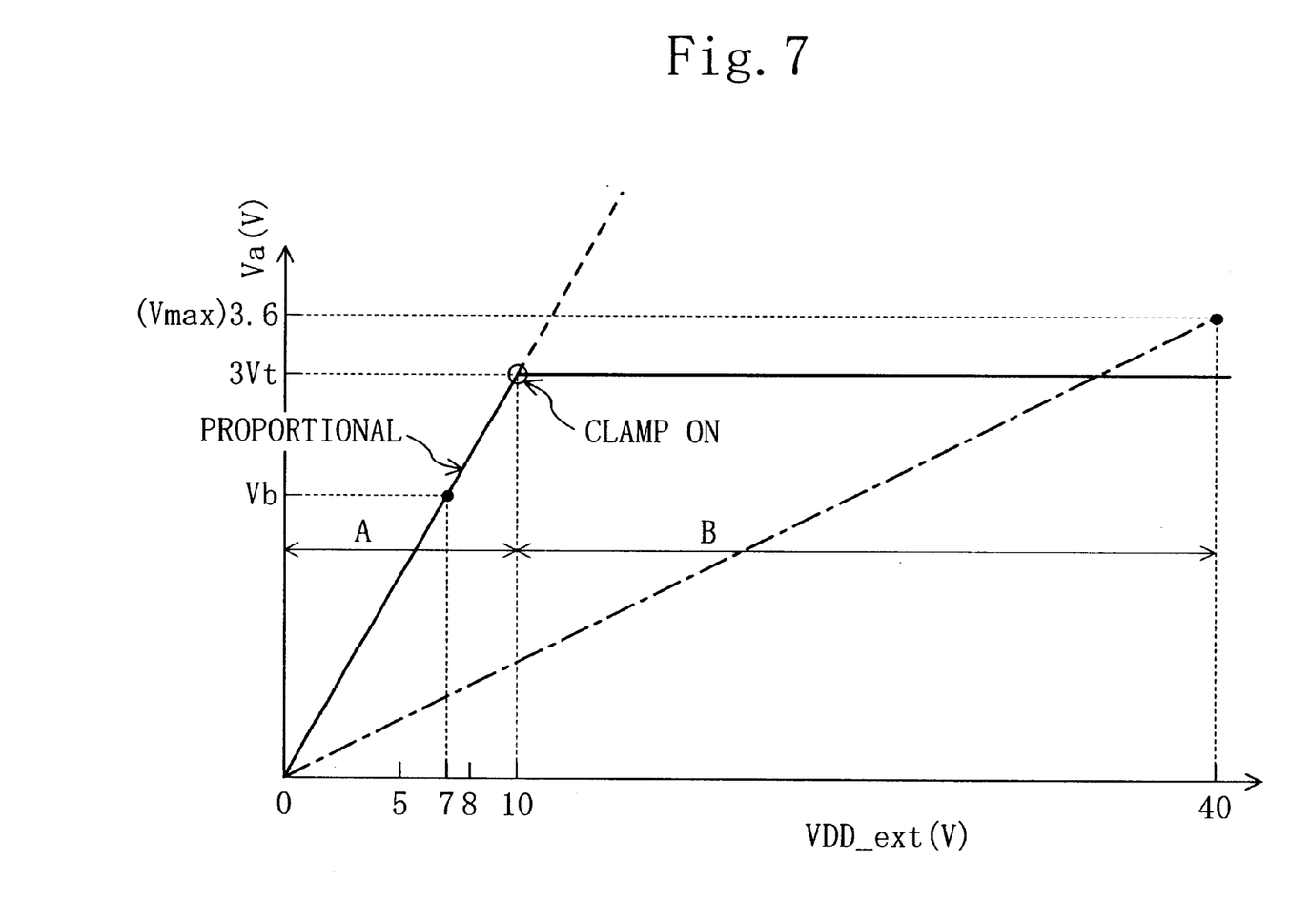
FIG. 7 is a graph showing the relationship between the external voltage and the converted voltage in the circuit configuration of FIG. 6.

FIG. 7 is a graph showing the relationship between the external voltage VDD_ext and the converted voltage Va in the circuit configuration of FIG. 6. In the comparison region A, as shown in FIG. 7, the external voltage VDD_ext and the converted voltage Va are in a proportional relationship owing to the resistor 6. Moreover, since the comparison voltage Vb serving as an input to the comparator 3 is set to about ½ of the power-source voltage, detection accuracy is improved in terms of the sensitivity of the comparator 3. In the region B, on the other hand, the clamping circuit 23 restricts the upper limit of the converted voltage Va to 3 Vt, so that the converted voltage Va does not exceed the withstand voltage Vmax.

Although the clamping circuit 23 is composed of the N-type MOS transistors in the configuration of FIG. 6, it may also be composed of P-type transistors. In this case, it is also possible to reduce the influence of the body effect by adjusting the substrate potential to be equal to the source potential.

Although the number of the transistors composing the claming circuit 23 is three in the configuration of FIG. 6, the number of the transistors may be determined arbitrarily depending on the limit voltage used for clamping and is not limited to three. The number of the transistors may also be determined appropriately based on the withstand voltage Vmax and the threshold voltage Vt of each of the transistors.

In the configuration of FIG. 6, the limit voltage used for clamping is expected to vary due to the varying characteristics of the transistors 23a, 23b, and 23c composing the clamping circuit 23. In that case, however, a problem associated with the operation of the circuit does not particularly occur provided that the limit voltage for clamping is in a range sufficiently higher than the comparison voltage Vb and sufficiently lower than the withstand voltage Vmax.

In the configuration of FIG. 4, the clamping circuit 23 of FIG. 6 may be provided instead of the clamping circuit 20. In the configuration of FIG. 4, the resistor 6 may be provided instead of the transistor 2A. In the configuration of FIG. 4 or 6, a transistor having a specified voltage applied to the gate thereof may be provided as a voltage dropping element instead of the transistor 2A or the resistor 6. It is also possible to render the slope of the curve sharp in the comparison region A by operating the transistor in an unsaturated linear region.

In the configuration of FIG. 4 or 6, additional comparison voltage generating means as shown in FIG. 3 may also be provided.

Instead of the diode-connected transistor 2 of FIG. 1 or the diode-connected transistor 2A of FIG. 4, a diode may also be provided. Instead of the diode-connected transistors 2 and 5 of FIG. 3, diodes may also be provided. Instead of the diode-connected transistors 23a, 23b, and 23c composing the clamping circuit 23 of FIG. 6, diodes may also be provided.

Figure 9:
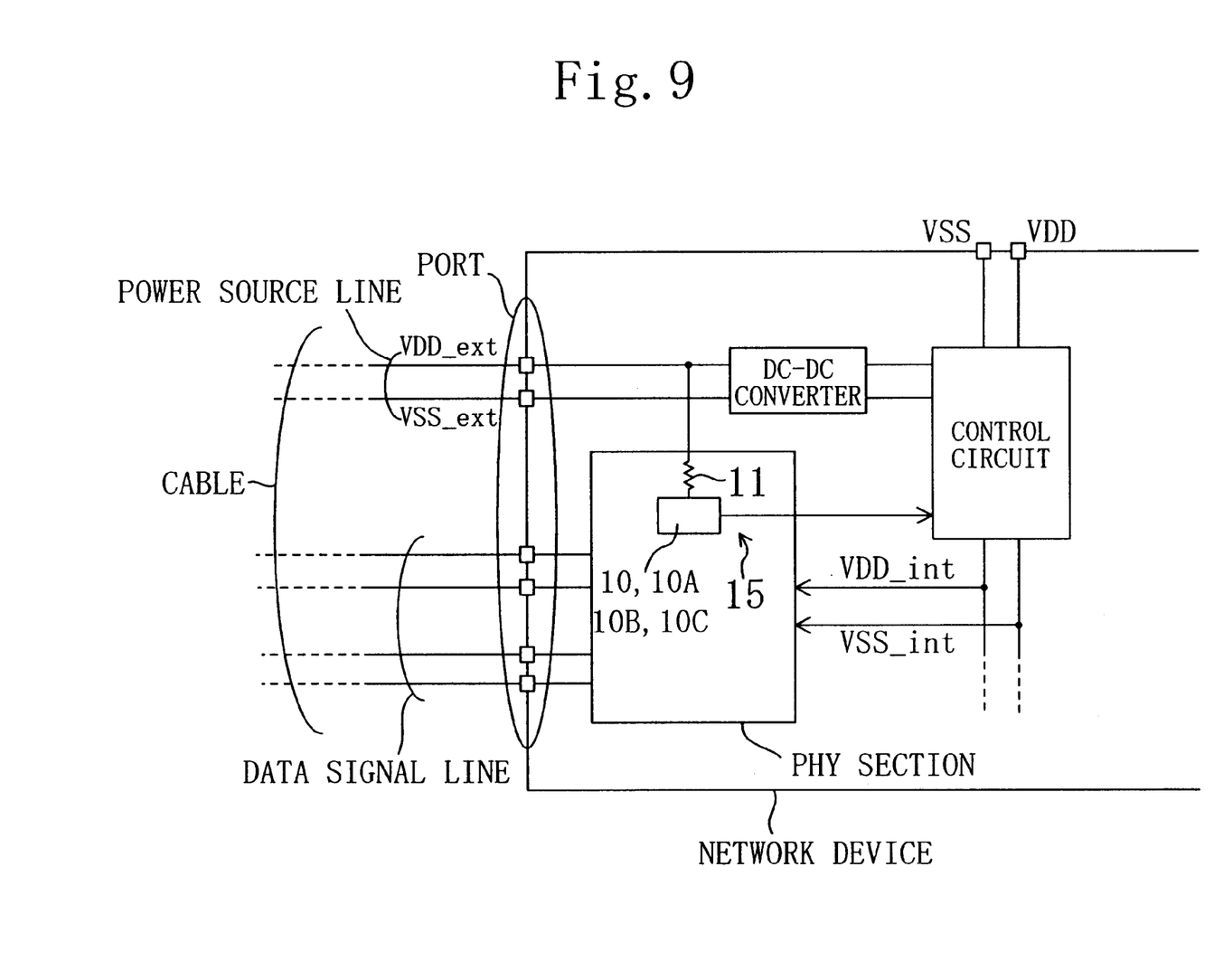
FIG. 9 shows an exemplary internal configuration of a network device composing a system as shown in FIG. 8.

FIG. 9 shows an exemplary internal configuration of a network device composing a system as shown in FIG. 8. In FIG. 9, a PHY section has the CPS function and comprises a voltage determining unit 15 for determining whether or not the external voltage VDD_ext supplied via a cable is within a specified range. By composing the voltage determining unit 15 by using any of the voltage control circuits 10, 10A, 10B, and 10C according to the individual embodiments and variations, the CPS function of the PHY section can be implemented with high accuracy.

Thus, the present invention provides a wide range of converted voltages in the comparison region, while preventing the converted voltage from exceeding the withstand voltage in a region in which the external voltage is higher than in the comparison region. This remarkably suppresses the influence given by variations in comparison voltage and variations in the detection accuracy of the comparing means to the determination of the external voltage, thereby enabling a higher-accuracy comparison between the external voltage and the reference voltage.

By using the voltage control circuit according to the present invention, it becomes possible to develop a PHY section conforming to the IEEE 1394 standard.

What is claimed is:

1. A voltage control circuit for detecting which one of an external voltage supplied from the outside and a reference voltage serving as a standard for comparison is higher, the circuit comprising:

an input terminal to which the external voltage is applicable via a voltage dropping resistor;

voltage converting means for converting, in conjunction with the voltage dropping resistor, the external voltage applied to the input terminal to a voltage lower than the external voltage; and comparing means for comparing a converted voltage outputted from the voltage converting means with a specified comparison voltage corresponding to the reference voltage and outputting a signal indicative of the result of comparison as a signal indicative of which one of the external voltage and the reference voltage is higher, said converted voltage and said reference voltage being generated by separate sources, the voltage converting means performing a voltage conversion such that a ratio of an increment of the converted voltage to an increment of the external voltage is non-linear over a given range of the external voltage.

2. The voltage control circuit of claim 1, wherein the voltage converting means comprises a diode or diode-connected transistor connected to the input terminal to be disposed in series to the voltage dropping resistor.

3. The voltage control circuit of claim 2, wherein the comparing means comprises comparison voltage generating means for generating the comparison voltage, the comparison voltage generating means comprising:

a constant current source; and a diode or diode-connected transistor disposed in series to the constant current source.

4. The voltage control circuit of claim 1, wherein the voltage converting means comprises:

a voltage dropping element connected to the input terminal to be disposed in series to the voltage dropping resistor; and a clamping circuit for limiting a voltage on a side of the voltage dropping element closer to the input terminal such that the voltage does not exceed a specified limit voltage.

5. The voltage control circuit of claim 4, wherein the clamping circuit comprises:

a transistor disposed in parallel with the voltage dropping element; and a comparator for receiving a drain voltage of the transistor as one input and the limit voltage as the other input, an output of the comparator serving as an input to a gate of the transistor.

6. The voltage control circuit of claim 4, wherein the clamping circuit comprises a single diode or diode-connected transistor disposed in parallel with the voltage dropping element or a plurality of diodes or diode-connected transistors disposed in series to each other and in parallel with the voltage dropping element.

7. The voltage control circuit of claim 4, wherein the voltage dropping element is a resistor, a diode, or a diode-connected transistor.

8. A network device connectable to a cable, the device comprising a voltage determining unit for determining whether or not an external supply voltage supplied via the cable is within a specified range, the voltage determining unit comprising:

a voltage control circuit as recited in claim 1; and a voltage dropping resistor having one end connected to the input terminal of the voltage control circuit and the other end to which the external supply voltage is given.

9. A method of detecting, in a network device, which one of an external supply voltage supplied via a cable and a reference voltage serving as a standard for comparison is higher, the method comprising the steps of:

converting the external supply voltage to a voltage lower than the external supply voltage; and comparing a converted voltage obtained in the voltage converting step with a specified comparison voltage corresponding to the reference voltage, said converted voltage and said reference voltage being generated by separate sources, the voltage converting step performing a voltage conversion such that a ratio of an increment of the converted voltage to an increment of the external supply voltage is non-linear over a given range of the external voltage.

10. The voltage control circuit of claim 1, wherein said ratio increases as the external voltage approaches the reference voltage.

11. The voltage control circuit of claim 9, wherein said ratio increases as the external voltage approaches the reference voltage.

* * * * *